(12) United States Patent
Shim

(10) Patent No.: US 8,217,447 B2
(45) Date of Patent: Jul. 10, 2012

(54) FLASH MEMORY DEVICE WITH A PLURALITY OF SOURCE PLATES

(75) Inventor: Cheon-Man Shim, Yeongdeungpo-gu (KR)

(73) Assignee: Dongbu HiTek Co., Ltd., Seoul (KR)

(*) Notice: Subject to any disclaimer, the term of this patent is extended or adjusted under 35 U.S.C. 154(b) by 181 days.

(21) Appl. No.: 12/633,616

(22) Filed: Dec. 8, 2009

(65) Prior Publication Data
US 2010/0163969 A1  Jul. 1, 2010

(30) Foreign Application Priority Data
Dec. 31, 2008 (KR) .................. 10-2008-0137868

(51) Int. Cl.
*H01L 29/792* (2006.01)
(52) U.S. Cl. .. 257/324; 257/314; 257/316; 257/E21.423
(58) Field of Classification Search .......... 257/314–316, 257/324
See application file for complete search history.

(56) References Cited

U.S. PATENT DOCUMENTS
7,053,438 B2 * 5/2006 Ding .............................. 257/314
* cited by examiner

*Primary Examiner* — Thanh Nguyen
(74) *Attorney, Agent, or Firm* — Sherr & Vaughn, PLLC

(57) ABSTRACT

A flash memory device and a method of manufacturing a flash memory device. A flash memory device may include an isolation layer and/or an active area over a semiconductor substrate, a memory gate formed over an active area, a control gate formed over a semiconductor substrate including a memory gate, and/or a common source line contact formed over a semiconductor substrate including a control gate. A flash memory device may include a source plate having substantially the same interval as an interval of an active area of a bit line. A source plate may include an active area in which a common source line contact may be formed. A common source line contact may include a long butting contact extending in a direction traversing an active area.

10 Claims, 3 Drawing Sheets

FLASH MEMORY DEVICE WITH A PLURALITY OF SOURCE PLATES

The present application claims priority under 35 U.S.C. 119 to Korean Patent Application No. 10-2008-0137868 (filed on Dec. 31, 2008) which is hereby incorporated by reference in its entirety.

BACKGROUND

Embodiments relate to an electric device and methods of manufacturing an electric device. Some embodiments relate to a flash memory device and a method of manufacturing a flash memory device.

Flash memory may include nonvolatile memory which may retain data stored therein even if power is turned off. Flash memory may record, read, and/or delete data at a relatively high speed. Accordingly, flash memory may be widely used, for example, for a Bios of a personal computer (PC), a set-top box, a printer, and/or a network server to store data. Flash memory may extensively be used for digital cameras, portable phones, and the like.

A flash memory device may be categorized as a stack gate type semiconductor device, which may include a floating gate, and/or as a semiconductor device, which may include a silicon-oxide-nitride-oxide-silicon (SONOS) structure. A flash memory device may include a structure in which unit cells may be densely arranged in a relatively narrow area to be competitive in a market. Accordingly, a source may be formed therein including a common source line instead of a contact. However, even though common source lines may be larger than bit lines, common source lines may have an irregular size, and/or may exert influence upon formation of adjacent bit lines such that, for example, a uniform pattern may not be formed.

SUMMARY

Embodiments relate to a flash memory device and a method of manufacturing a flash memory device. According to embodiments, a flash memory device may include an isolation layer and/or an active area formed on and/or over a semiconductor substrate. In embodiments, a flash memory device may include a memory gate which may be formed on and/or over an active area. In embodiments, a flash memory device may include a control gate which may be formed on and/or over a semiconductor substrate including a memory gate. In embodiments, a flash memory device may include a common source line contact formed on and/or over a semiconductor substrate including a control gate.

According to embodiments, a flash memory device may include a source plate. In embodiments, a source plate may include substantially the same interval as an interval of an active area of a bit line. In embodiments, a source plate may include an active area in which a common source line contact may be formed. In embodiments, a common source line contact formed on and/or over a source plate may include a long butting contact which may extend in a direction traversing an active area.

DRAWINGS

Figure 1:
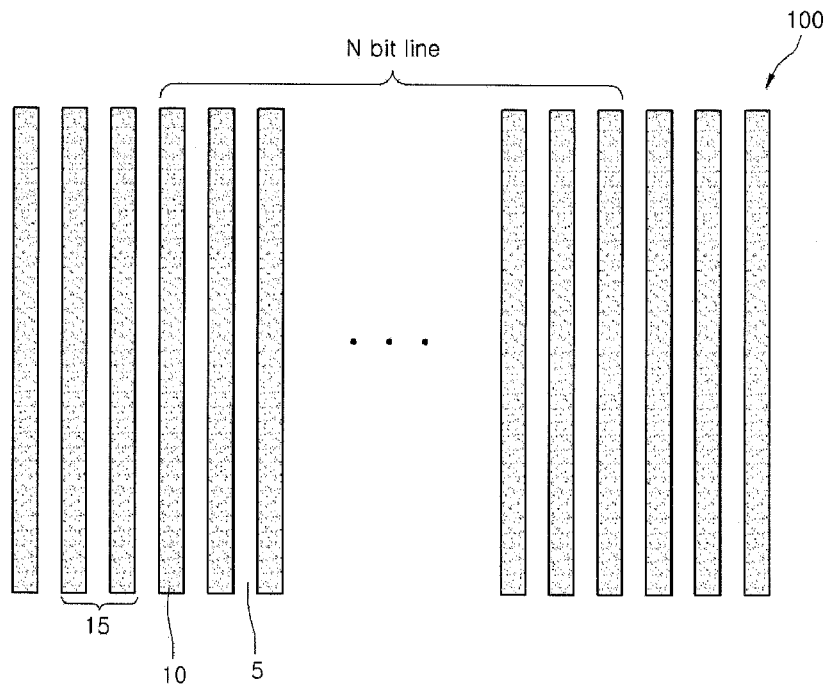
Figure 2:
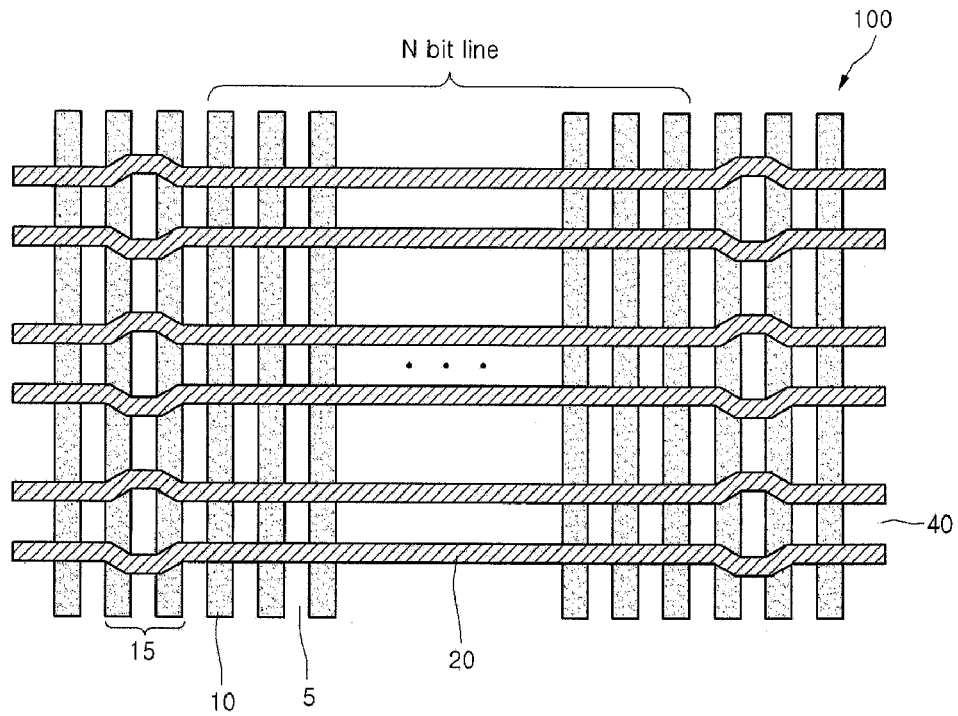
Figure 3:
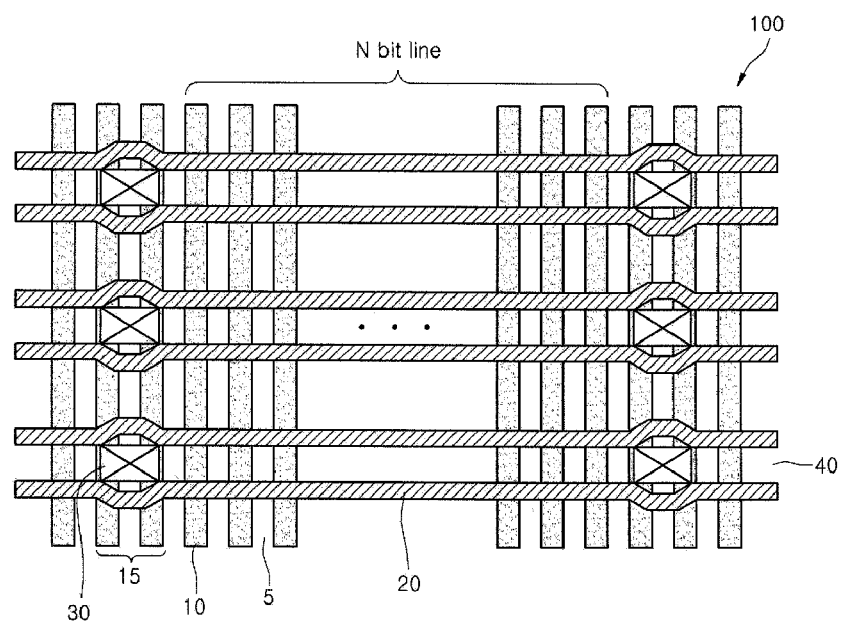

Example FIG. 1 to FIG. 3 are plan views illustrating a method of manufacturing a flash memory device in accordance with embodiments.

Figure 4:
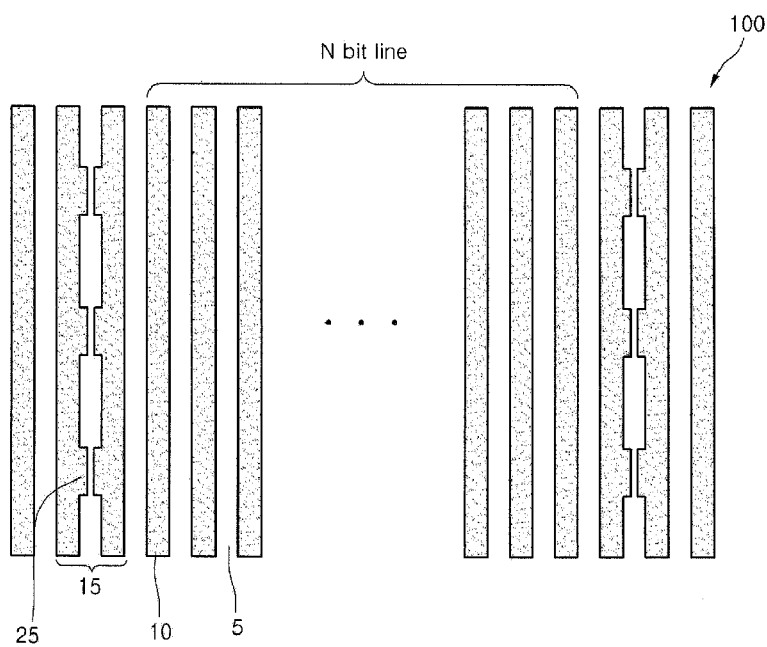
Figure 5:
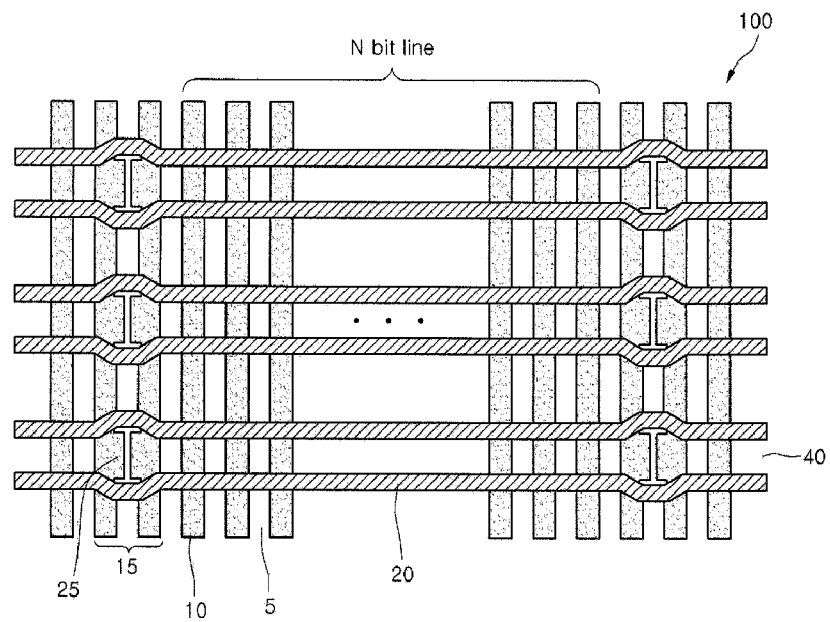
Figure 6:
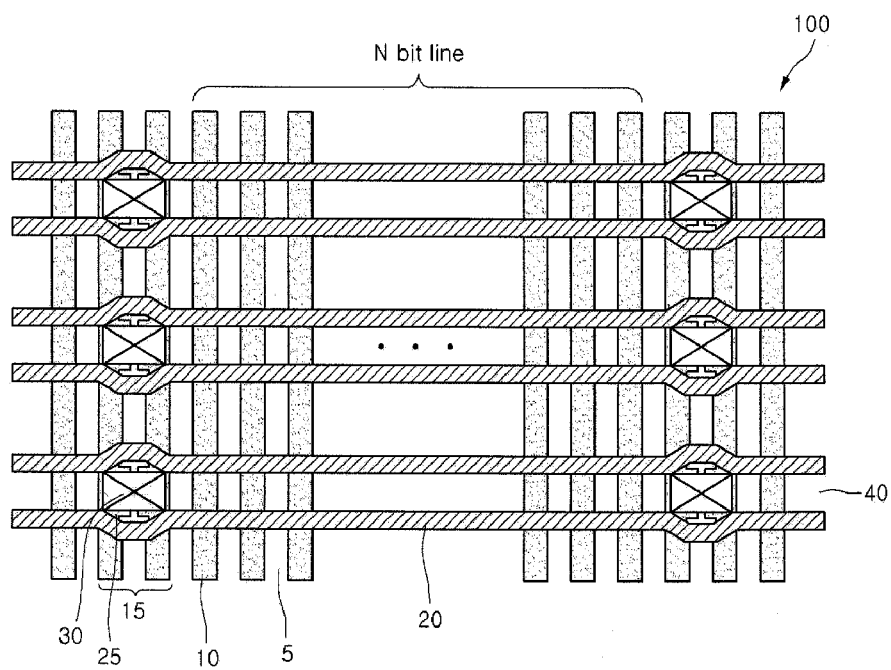

Example FIG. 4 to FIG. 6 are plan views illustrating a method of manufacturing a flash memory device in accordance with embodiments.

DESCRIPTION

Embodiments relate to a method of manufacturing a flash memory device. Referring to example FIG. 1 to FIG. 3, plan views illustrate a method of manufacturing a flash memory device in accordance with embodiments. Referring to FIG. 1, isolation layer 5 may be formed on and/or over semiconductor substrate 100, which may define active area 10. According to embodiments, isolation layer 5 may be formed after forming a trench on and/or over semiconductor substrate 100. In embodiments, an insulating material may be disposed in a trench, and may substantially fill a trench.

According to embodiments, source plate 15 may include active area 10 for a common source line contact, which may be formed having substantially the same interval as that of an active area of a bit line. In embodiments, an active area of source plate 15 and/or an active area of a bit line may have substantially the same interval such that a mask may be relatively simply manufactured and/or insulating materials forming an isolation layer may be relatively easily filled. In embodiments, source plate 15 may be formed having substantially the same interval as a bit line contact such that source plate 15 may include a plurality of active areas 10.

According to embodiments, expansion area 25 may be formed. In embodiments, expansion area 25 may be formed together with isolation layer 5. In embodiments, a photo process may be performed to form a trench of isolation layer 5, such that a trench may have substantially the same interval as a bit line. In embodiments, a memory gate may be formed on and/or over semiconductor substrate 100, for example after forming active area 10 including expansion area 25. In embodiments, a floating gate including polysilicon may be formed, for example when a memory gate has a stack gate type. In embodiments, a memory gate is not limited to a stack gate type, but may include a silicon-oxide-nitride-oxide-silicon (SONGS) type memory structure for example.

Referring to FIG. 2, control gate 20 may be formed on and/or over a semiconductor substrate including a memory gate. According to embodiments, control gate 20 may include polysilicon. In embodiments, control gate 20 may cross active area 10. In embodiments, an ion implantation process may be performed with respect to semiconductor substrate 100 to form a source and/or a drain.

Referring to FIG. 3, common source contact 30 may be formed on and/or over common source line 40, and/or may be formed on and/or over source plate 15 of semiconductor substrate 100. According to embodiments, common source line contact 30 may include a long butting contact, which may extend in an X axis and/or cross active area 10. In embodiments, active area 10 of source plate 15 may have substantially the same interval as that of an active area of a bit line, such that active area 10 of source plate 15 may include a long butting contact extending in a horizontal axis to connect a plurality of source plates 15, which may be separated from each other, to each other. In embodiments, common source line contact 30 may be formed through a contact forming process after forming an interlayer dielectric layer on and/or over semiconductor substrate 100. In embodiments, common source line contact 30 of source plate 15 may be formed such that a common voltage may be applied to common source line 40 in a unit of N bit lines.

Embodiments relate to a method of manufacturing a flash memory device. Referring to example FIG. 4 to FIG. 6, plan views illustrate a method of manufacturing a flash memory device in accordance with embodiments. Referring to FIG. 4, isolation layer 5 may be formed on and/or over semiconductor substrate 100, which may define active area 10. According to embodiments, isolation layer 5 may be formed after forming a trench on and/or over semiconductor substrate 100, and an insulating material may substantially fill a trench.

According to embodiments, source plate 15 may include active area 10 in which a common source line contact may be formed, and an active area for a bit line may be formed having substantially the same interval. In embodiments, expansion area 25 may be formed. In embodiments, expansion area 25 may protrude from active area 10 of source plate 15, in which a common source line contact may be formed. In embodiments, expansion area 25 may protrude toward a neighboring source plate 15 such that a distance between source plates 15 may be shortened. In embodiments, expansion area 25 may be formed together with isolation layer 5.

According to embodiments, a trench may have substantially the same interval with a bit line, for example when a photo process may be performed to form a trench of isolation layer 5. In embodiments, an area for a common source line contact may be formed by preparing expansion area 25 between active areas 10 adjacent to each other. In embodiments, a plurality of expansion areas 25 may be formed on and/or over source plates 15 such that expansion areas 25 may face each other between source plates 15. In embodiments, expansion area 25 may be formed between at least two adjacent active areas 10.

According to embodiments, a memory gate may be formed on and/or over semiconductor substrate 100, for example after forming active area 10 including expansion area 25. In embodiments, a floating gate including polysilicon may be formed, for example when a memory gate has a stack gate type. In embodiments, a memory gate is not limited to a stack gate type. In embodiments, a memory gate may include a SONOS type memory structure, for example.

Referring to FIG. 5, control gate 20 may be formed on and/or over semiconductor substrate 100 including a memory gate. In embodiments, control gate 20 may include polysilicon. In embodiments, control gate 20 may cross active area 10. In embodiments, an ion implantation process may be performed with respect to semiconductor substrate 100 to form a source and/or a drain.

Referring to FIG. 6, common source contact 30 may be formed at active area 25 on and/or over source plate 15 of semiconductor substrate 100. In embodiments, active area 25 may be formed on and/or over source plate 15 of common source line 40. In embodiments, common source line contact 30 may include a long butting contact, which may extend in an X axis and/or cross active area 10. In embodiments, active area 10 of source plate 15 may have substantially the same interval as that of active area 10 of a bit line, such that active area 10 of source plate 15 may include a long butting contact extending in a horizontal axis to connect a plurality of source plates 15, which may be separated from each other, to each other. In embodiments, common source line contact 30 may be formed through a contact forming process after forming an interlayer dielectric layer on and/or over semiconductor substrate 100. In embodiments, common source line contact 30 of the source plate 15 may include expansion area 25 and/or may be formed such that a common voltage may be applied to common source line 40 in a unit of N bit lines.

According to embodiments, a method of manufacturing a flash memory device and a flash memory device in accordance with embodiments may include a source plate, in which a source contact may be formed, and/or may include an active area with substantially the same interval as that of a bit line area. In embodiments, a variation of a bit line adjacent to a source plate may be minimized. In embodiments, an expansion area may be formed on and/or over a source plate corresponding to a area for a source contact, and/or a butting contact may be formed on and/or over a source plate including an expansion area. In embodiments, a characteristic of a memory device may be substantially stabilized. In embodiments, an active area of a source plate may have substantially the same interval as that of an active area of a bit line area, such that a mask may be relatively simply manufactured, and/or a gap fill of an insulating material to form an isolation layer may be relatively easily achieved.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising
an isolation layer and plurality of active areas over a semiconductor substrate, wherein the plurality of active areas are spaced apart from each other in a regular interval distance;
at least one of a memory gate, a control gate and a common source line contact over said semiconductor substrate; and
a plurality of source plates, wherein said plurality of source plates are spaced apart from each other in the regular interval distance that is substantially the same interval distance as the regular interval distance of plurality of active areas of a bit line.

2. The apparatus of claim 1, wherein said source plate comprises an active area over which a common source line contact is formed.

3. The apparatus of claim 2, wherein said common source line contact comprises a long butting contact extending in a direction traversing said active area of said source plate.

4. The apparatus of claim 3, wherein said long butting contact connects at least two active areas of said source plate.

5. The apparatus of claim 3, wherein said long butting contact is connected with adjacent expansion areas.

6. The apparatus of claim 2, comprising an expansion area over said active area of said source plate.

7. The apparatus of claim 6, wherein said expansion area and said isolation layer are simultaneously formed.

8. The apparatus of claim 2, comprising a plurality of expansion areas over said source plate over which said common source line contact is formed.

9. The apparatus of claim 1, comprising a flash memory device.

10. The apparatus of claim 1, wherein said memory gate comprises at least one of:
a stack gate type; and
a silicon-oxide-nitride-oxide-silicon structure.

* * * * *